United States Patent [19]

Yamamoto

[11] Patent Number: 4,810,920

[45] Date of Patent: Mar. 7, 1989

[54] ACOUSTIC SURFACE WAVE MULTIMODE FILTER COMPRISING A BUS BAR WHICH IS THICKER THAN ACOUSTIC SURFACE WAVE RESONATORS

[75] Inventor: Yasushi Yamamoto, Tokyo, Japan

[73] Assignee: NEC Corporation, Tokyo, Japan

[21] Appl. No.: 900,921

[22] Filed: Aug. 27, 1986

[30] Foreign Application Priority Data

Aug. 27, 1985 [JP] Japan .................. 60-186695

[51] Int. Cl.⁴ ............................................ H01L 41/04
[52] U.S. Cl. ............................ 310/313 D; 310/313 C; 333/154
[58] Field of Search ........... 310/313 B, 313 C, 313 D, 310/313 R, 321, 322, 323, 325, 327, 363, 364, 365, 366, 312; 367/140, 141, 157, 161, 164; 333/150, 154, 193, 194, 202, 203, 204, 205

[56] References Cited

U.S. PATENT DOCUMENTS

| | | | |
|---|---|---|---|
| 4,143,340 | 3/1979 | Munsinger | 310/313 B |
| 4,160,963 | 7/1979 | Mays, Jr. | 310/313 C X |
| 4,364,017 | 12/1982 | Tokunaga et al. | 310/313 R X |
| 4,571,519 | 2/1986 | Kawabata at el. | 310/313 A |

FOREIGN PATENT DOCUMENTS 130140 of 1984 Japan .
197503 3/1975 Netherlands .................. 310/313

OTHER PUBLICATIONS

Tiersten et al., Guided Acoustic Surface Wave Filters, Ultrasonics Symp. Proc., IEEE Cat. #75 CHO994-4SU (1975), pp. 293-294.
Lean et al., Scanned Magnetostrictive Sensors, IBM Technical Disclosure Bulletin, vol. 17, #12, 5/75.
Meuvel et al., The Hybrid Transducer, Paper C-8; IEEE Ultrasonics Symp., 9/69, pp. 1-8.

*Primary Examiner*—Brian S. Steinberger
*Attorney, Agent, or Firm*—Sughrue, Mion, Zinn, Macpeak, and Seas

[57] ABSTRACT

In an acoustic surface wave multimode filter comprising a pair of acoustic surface wave resonators and a bus bar on a piezoelectric substrate with the bus bar shared by the resonators, the bus bar is rendered thicker than the resonators. Preferably, the bus bar should be about twice as thick as the resonators.

2 Claims, 2 Drawing Sheets

U.S. Patent    Mar. 7, 1989    Sheet 1 of 2    4,810,920
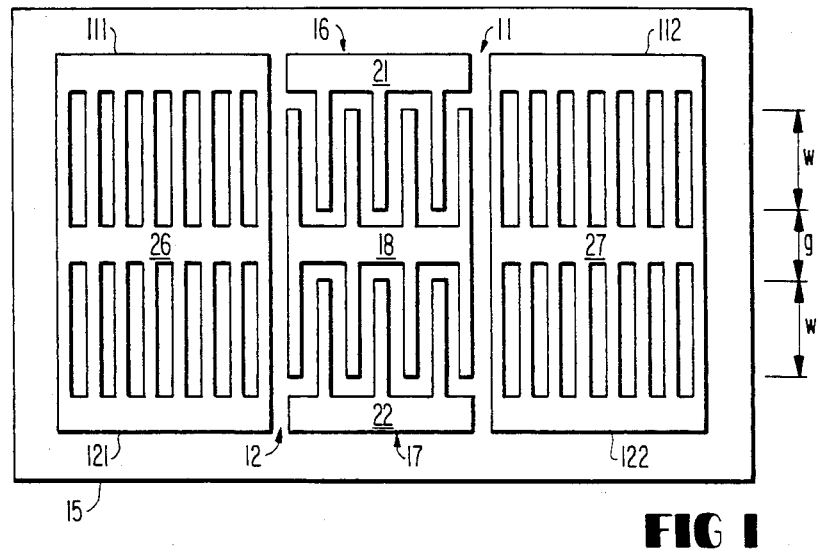
FIG 1
PRIOR ART
FIG 2
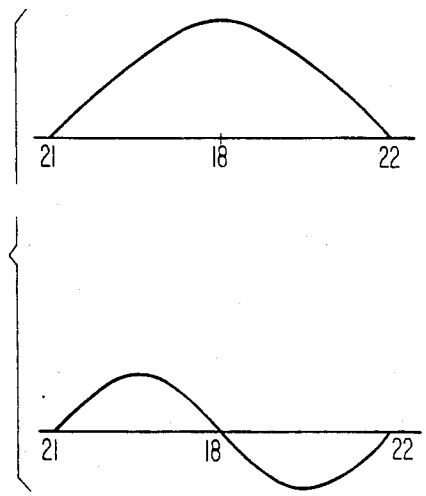
FIG 4
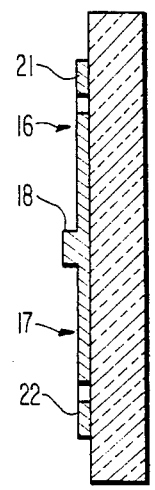

ACOUSTIC SURFACE WAVE MULTIMODE FILTER COMPRISING A BUS BAR WHICH IS THICKER THAN ACOUSTIC SURFACE WAVE RESONATORS

BACKGROUND OF THE INVENTION

This invention relates to an acoustic or elastic surface wave multimode filter which makes use of an acoustic surface wave or surface acoustic wave (SAW).

Such multimode filters are described, for example, in a paper submitted by H. F. Tiersten et al to the "1975 Ultrasonics Symposium Proceedings" of the IEEE, pages 293 and 294, under the title "Guided Acoustic Surface Wave Filters." According to the Tiersten et al paper, the multimode filter comprises a piezoelectric substrate and a pair of acoustic surface wave resonators on the substrate. Each resonator is called a "strip guide" in the Tiersten et al paper and comprises an interdigital transducer and a pair of reflecting arrays on both sides of the interdigital transduder. In outline, each resonator is rectangular and has a length and a width, namely, a pair of long sides and a pair of short sides. The resonators are arranged side by side with the long sides disposed parallel and with the short sides aligned. A spacing is left between two adjacent sides of the respective resonators. The multimode filter serves as a band-pass filter and may comprise three or more resonators to provide more than two poles. Such multimode filters may be connected in tandem to form a higher-order filter.

It is already known that the multimode filter has a relative band width dependent on the width of each resonator and the spacing between the resonators. The spacing must be as small as possible in order to make the multimode filter have a wide passband.

An acoustic surface wave multimode filter is revealed in Japanese patent application No. 130,140/1982 of Yûzô Nakazawa et al (Kokai No. 131,213/1984). According to the Japanese patent prepublication, each resonator may consist of an interdigital transducer alone. The above-described width and spacing are discussed in detail.

In various embodiments of the invention of Nakazawa et al, a bus bar is formed on the substrate between adjacent long sides of two resonators so as to be shared by the resonators. The bus bar is given a narrow width on order to render the spacing between resonators narrow. It is to be noted that the relative band width is restricted by the width of the bus bar. The bus bar has a sheet resistance. It has now been found by applicant that the sheet resistance results in increased insertion loss of the multimode filter and in a dull cutoff characteristic. Such defects become more serious when the frequencies are higher. This makes it difficult to use the multimode filter in the UHF band.

SUMMARY OF THE INVENTION

It is therefore an object of the present invention to provide an acoustic surface wave multimode filter which serves as a band-pass filter of a wide passband.

It is another object of this invention to provide a multimode filter of the type described, which has a small insertion loss.

It is still another object of this invention to provide a multimode filter of the type described, which has a sharp cutoff characteristic.

It is yet another object of this invention to provide a multimode filter of the type described, which can be practically used in the UHF or VHF band.

Other objects of this invention will become clear as the description proceeds.

According to this invention, there is provided an acoustic surface wave multimode filter which comprises a piezoelectric substrate, first and second acoustic surface wave resonators disposed on the substrate and having conductor patterns formed to a common depth or thickness onthe substrate, and a bus bar on the substrate shared by the first and second acoustic surface wave resonators and which is characterised in that the conductive pattern or patterns forming the bus bar are thicker than those forming the first and the second acoustic surface wave resonators.

BRIEF DESCRIPTION OF THE DRAWING

FIG. 1 schematically shows a plan view of a conventional acoustic surface wave multimode filter;

FIG. 2 is a diagram for use in describing the operation of an acoustic surface wave multimode filter in general;

FIG. 4 schematically shows a cross-section taken along line 4—4 of FIG. 3; and

DESCRIPTION OF THE PREFERRED EMBODIMENT

Figure 3:
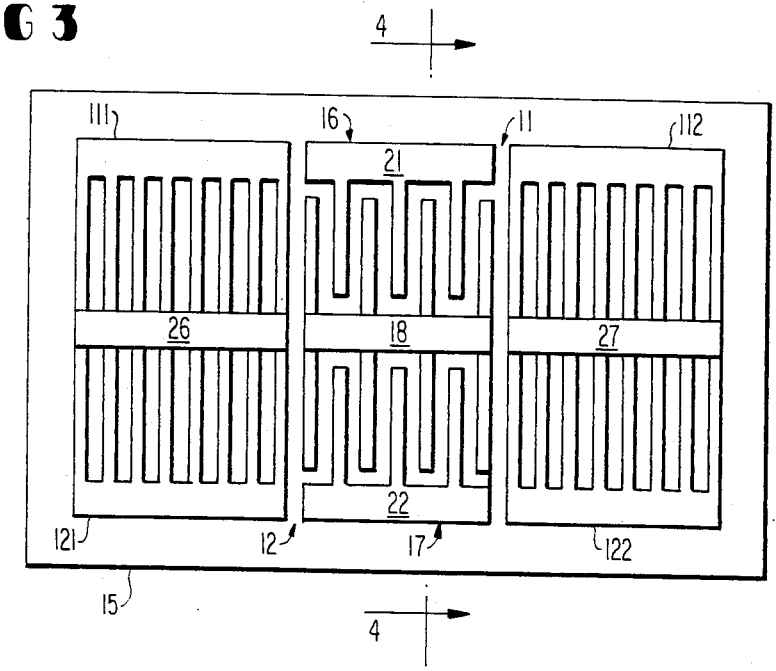
FIG. 3 schematically shows a plan view of an acoustic surface wave multimode filter according to an embodiment of the instant invention.

Referring to FIG. 1, a conventional acoustic surface wave multimode filter will be described at first in order to facilitate an understanding of the present invention. The multimode filter comprises first and second acoustic surface wave resonators 11 and 12 on a piezoelectric substrate 15 which may be an ST-cut quartz substrate having a polished surface. The first and the second (acoustic surface wave) resonators 11 and 12 may be formed of aluminium conductor patterns or like metallic films of a thin uniform thickness, and have a pattern configuration which is symmetric with respect to a center line as will presently be described in detail. Each resonator 11 or 12 is rectangular in outline and has a length or a pair of long sides and a width or a pair of short sides. The multimode filter is of the type disclosed in the above-referenced Japanese patent prepublication.

The first and the second resonators 11 and 12 comprise first and second interdigital transducers 16 and 17 which share a bus bar 18 formed on the substrate 15 along the center line. Depending on the circumstances, the bus bar 18 will be referred to as a middle bus bar for a reason which will shortly become clear. The first interdigital transducer 16 has a first strip electrode 21 opposite to the bus bar 18. Similarly, the second interdigital transducer 17 has a second strip electrode 22 opposite to the bus bar 18. Each interdigital transducer 16 or 17 has interlocked comb-shaped electrodes. The comb-shaped electrodes which are connected to either of the strip electrodes 21 or 22 will be called first-set electrodes. Those connected to the bus bar 18 will be called second-set electrodes. Each of the first-set and the second-set electrodes has a length w of interlock. It is convenient to designate the length w as the above-described width and the distance g between the widths w's of the first and the second interdigital transducers 16 and 17 as the spacing.

It will be assumed that the first interdigital transducer 16 is used as a driving transducer and the second interdigital transducer 17, as a driven transducer. When an input voltage is supplied between the first strip electrode 21 and the bus bar 18, an acoustic surface wave travels along the surface of the piezoelectric substrate 15. Travelling along the surface, the surface wave gives rise to an acoustic coupling between the first and the second interdigital transducers 16 and 17 in a manner which will later be discussed in detail. As a result of the acoustic coupling, an output voltage is developed across the second strip electrode 22 and the bus bar 18.

On both sides of the first interdigital transducer 16, the first resonator 11 comprises two reflecting arrays or gratings which will be called first left and right reflectors and designated by reference numerals 111 and 112. Likewise, the second resonator 12 comprises second left and right reflectors 121 and 122. The first and the second left reflectors 111 and 121 share a left bus bar 26. The first and the second right reflectors 112 and 122 share a right bus bar 27. The middle, the left, and the right bus bars 18, 26, and 27 are ordinarily grounded. It is therefore possible to understand that a single common bus bar is shared by the first and the second resonators 11 and 12.

In FIG. 1, the bus bars 18, 26, and 27 have a bus bar thickness which is equal to the uniform thickness. The reflectors 11 and 121 or 121 and 122 are for reflecting the acoustic surface wave which travels lengthwise of each resonator 11 or 12, namely, parallel to the long sides of the respective resonators 11 and 12. It may be mentioned here that the surface wave travels perpendicularly of each width w at a speed which is slower than the speed along the first or the second strip electrode 21 or 22 and extensions thereof in the reflectors 111 and 112 or 121 and 122.

Turning to FIG. 2, the above-described acoustic coupling results in excitation of displacements in a symmetric and an antisymmetric mode. In the figure, the symmetric and the antisymmetric modes are depicted above and below, respectively, with the abscissae used to represent a measure along the widths w of the respective resonators 11 and 12 (FIG. 1) with the positions of the bus bar 18 and the first and the second strip electrodes 21 and 22 being as indicated. The ordinates show the displacements.

In FIGS. 1 and 2, it is known that the acoustic coupling appears when the energy of the acoustic surface wave spreads from the first interdigital transducer 16 to the second interdigital transducer 17 beyond the width w of the first interdigital transducer 16 and the spacing g. Therefore, the acoustic coupling does not appear either when the width w is wider than a threshold width or when the spacing g is broader than a threshold spacing. Furthermore, the acoustic coupling has a strength or efficiency which largely depends on the width w and the spacing g.

When the excitation occurs in the symmetric and the antisymmetric modes at symmetric and antisymmetric resonant frequencies Fs and Fa, the multimode filter becomes a double mode filter of a bandwidth which depends on the frequency difference between the symmetric and the antisymmetric resonant frequencies, namely, (Fa−Fs). The frequency difference strongly depends on the spacing g, appreciably on the width w, and a little on the uniform thickness. A wide frequency difference is therefore achieved mainly by making the bus bar 18 have a narrow width. It has now been confirmed by applicant that the sheet resistance of the bus bar 18 makes the multimode filter have an increased insertion loss and a dull cutoff characteristic. In addition, the acoustic surface wave travels across each width w and along the spacing g at different speeds in general. This adversely affects the efficiency of acoustic coupling in a manner which will later be discussed in detail.

Referring now to FIGS. 3 and 4, the acoustic surface wave multimode of the invention comprises similar parts designated by like reference numerals. The middle bus bar 18 is thicker (i.e., is formed to a greater depth on the substrate) than the patterns which from the first and the second interdigital transducers 16 and 17. Similarly, the left and the right bus bars 26 and 27 are thicker than the patterns forming the first and the second left reflectors 111 and 121 and the first and the second right reflectors 112 and 122. In the example being illustrated, the conductive patterns forming the interdigital transducers 16 and 17 and the reflectors 111, 112, 121, and 122 have a common thinner thickness. The bus bars 18, 26, and 27 have a thicker common thickness, as best illustrated in FIG. 4.

It is possible to manufacture the multimode filter by either of two methods. According to a first a method which may be called a lift-off method, aluminium electrodes are evaporated onto the polished surface of the piezoelectric substrate 15 to the common thinner thickness to provide the first and the second resonators 11 and 12 and lower layers of the bus bars 18, 26, and 27. A photoresist is formed on the substrate 15 to cover the aluminium electrodes of the common thinner thickness. The photoresist is selectively removed at portions corresponding to the bus bars 18, 26, and 27 to expose the lower layers at these portions. An aluminium film is evaporated onto the lower layers up to the common thicker thickness above the substrate 15. The electrode film may laterally extend onto the remaining resist. The remaining resist is then peeled off. According to a second method, layer portions of the bus bard 18, 26, and 27 are formed first to a thickness which is equal to the common thicker thickness minus the thinner common thickness. Electrodes are subsequently evaporated or otherwise deposited to the common thinner thickness to complete the formation of the resonators 11 and 12 and the bus bars 18, 26, and 27.

Qualitatively speaking, the thick bus bars 18, 26, and 27 reduce the sheet resistance. The multimode filter therefore has a low insertion loss and a sharp cutoff characteristic.

Figure 5:
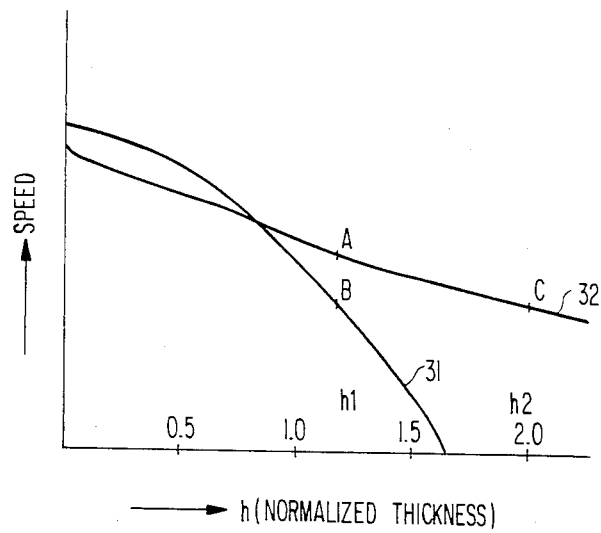
FIG. 5 is a diagram for use in describing the principles on which this invention is based.

Turning to FIG. 5, attention will be directed to the speed at which the acoustic surface wave propagates parallel to the long sides of the first and the second resonators 11 and 12. The common thicknesses of the first-set and the second-set electrodes and of the bus bars 18, 26, and 27 will be normalized into a normalized thickness h by the pitch period of the first-set or the second-set electrodes in each interdigital transducer 16 or 17. In the manner depicted by a first curve 31 (which shows the speed of the surface wave across the width w, namely, perpendicular of the bus bars 18, 26 and 27), the speed across the width w decreases relatively sharply with an increase in the common thinner thickness. This is due to the storage of the acoustic surface wave energy in an evanescent mode at edges of the first-set and the second-set electrodes. In contrast, the speed along the bus bars 18, 26, and 27 only gradually decreases with an increase in the common thicker thickness, in the manner illustrated by a second curve 32 (which shows the speed along the bus bars 18, 26 and 27). It will be seen that the speed along the bus bars 18, 26, and 27 is slower than the speed across the width w when the normalized thickness h is thinner than about 0.8 (percent). That is, between curves 31 and 32, a cross point appears at the normalized thickness of 0.8 (percent). This is contradictory to the conventional assumption that the speed across the width w is slower than the speed on both sides of the width w, namely, along the first or second strip electrodes 21 or 22 and extensions thereof in the left and the right reflectors 111 or 121 and 112 or 122 and along the bus bars 18, 26, and 27.

The curves 31 and 32 will be more closely examined. With a conventional acoustic surface wave multimode filter wherein the resonators 11 and 12 and the bus bars 18, 26, and 27 are equally thin, the uniform thickness may correspond to a first normalized thickness h1. In this event, the speed along the bus bars 18, 26, and 27 is indicated by a first pont A and is in fact faster than the speed at which the acoustic surface wave travels across the width w, which is indicated by a second point B.

According to the theory of coupling between the modes, the acoustic coupling reaches its highest efficiency when the acoustic surface wave travels across each width w and along the bus bars 18, 26, and 27 at a common speed. In this case, the multimode filter has its widest passband. When the first normalized thickness h1 is given to the resonators 11 and 12, the surface wave travels across each width w at the speed indicated by point B. The surface wave travels with the same speed along the bus bars 18, 26, and 27 if a second normalized thickness h2 is given thereto such that the surface wave speed is represented by point C. In other words, the bus bars 18, 26, and 27 should be about twice as thick as the resonators 11 and 12.

While this invention has thus far been described in specific conjunction with a single preferred embodiment thereof, it will now be readily possible for one skilled in the art to carry this invention into effect in various other manners. For example, it is possible to use a single bus bar instead of the middle, the left, and the right bus bars 18, 26, and 27.

What is claimed is:

1. An acoustic surface wave multimode filter, comprising: a piezoelectric substrate, first and second acoustic surface wave resonators disposed on said substrate and being formed of a conductor pattern formed to a first depth thickness on said substrate, and bus bar means formed on said substrate and shared by said first and second acoustic surface wave resonators, said bus bar means being comprised of a conductor pattern formed to a second depth thickness on said substrate, said second depth thickness being larger than said first depth thickness whereby said filter has reduced insertion loss, sharp cutoff characteristics and utility in UHF and VHF bands.

2. An acoustic surface wave mulitmode filter as claimed in claim 1, wherein said second depth thickness is approximately twice as large as said first depth thickness.

* * * * *

UNITED STATES PATENT AND TRADEMARK OFFICE
CERTIFICATE OF CORRECTION

PATENT NO. : 4,810,920

DATED : March 7, 1989

INVENTOR(S) : Yasushi YAMAMOTO

It is certified that error appears in the above-identified patent and that said Letters Patent is hereby corrected as shown below:

Col. 1, line 22, delete "transduder" and insert --transducer--,

Col. 2, line 11, delete "onthe substrate" and insert -- on the substrate--,

Col. 6, line 27, delete "mulitmode" and insert --multimode--.

Signed and Sealed this

Thirty-first Day of July, 1990

Attest:

HARRY F. MANBECK, JR.

*Attesting Officer*     *Commissioner of Patents and Trademarks*